HIGH EFFICIENCY SEMICONDUCTOR LIGHT EMITTER

Filed Dec. 29, 1965

INVENTORS:
JOHN R. BARRETT,
HAROLD A. JENSEN,
BY Richard Lang
THEIR ATTORNEY.

United States Patent Office 3,353,051
Patented Nov. 14, 1967

3,353,051
HIGH EFFICIENCY SEMICONDUCTOR LIGHT EMITTER

John R. Barrett, Fayetteville, and Harold A. Jensen, Liverpool, N.Y., assignors to General Electric Company, a corporation of New York Filed Dec. 29, 1965, Ser. No. 517,395
9 Claims. (Cl. 313—113)

ABSTRACT OF THE DISCLOSURE

The present invention relates to semiconductor light emitters and in particular to a new configuration for such light emitters which provides enhanced escape quantum efficiency. Such an enhancement in light efficiency is provided by creating a light emissive junction in a mesa region and by shaping the mesa so as to form an efficient light collecting reflector for redirecting the light generated in the junction through the surface of the semiconductor body remote from the mesa region. An efficient reflection surface is provided by making the mesa walls suitably oblique (35–45°) and by making the height of the mesa a substantial fraction (typically ¼) of its width.

Figure 1:
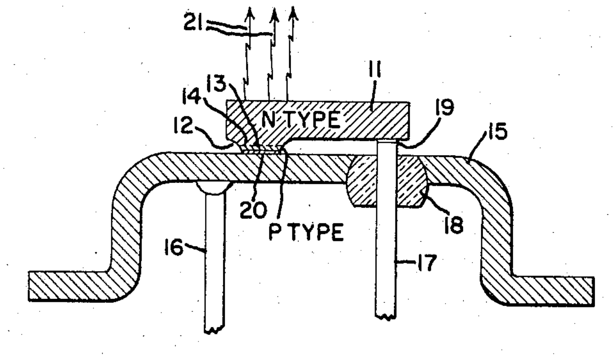

A large family of semiconductor devices optimized for light production exist today. These devices are typified by the common gallium arsenide junction devices producing light in the near infrared portion of the spectrum when current is passed through them. The gallium arsenide devices are doped to impurity concentrations in the neighborhood of $10^{18}$ per cc. with a dopant selected from such materials as selenium, tellurium or tin. In all these devices, the light is developed internally.

In most light producing semiconductor devices, a severe problem is posed in achieving adequate light output efficiency. Two properties of these materials complicate efficient utilization of this internally developed light. The first is the high absorptivity of the constituent materials. This property ordinarily dictates that the structure be arranged so that the light is required to pass through a minimum thickness of materil before emerging through the light emitting surface. The second property is the extremely high index of refraction of these materials. In the case of gallium arsenide it is approximately 3.5. The effect of this high index of refraction is to bar all light from emergence through a surface which has an angle of incidence in excess of about 15°, the critical angle. Even the light which is less than the critical angle is subject to substantial boundary reflective loss.

For these reasons, efficient ways of deriving this internally generated light have been matters of concern. In general, the proposals which have been made to solve these problems have involved complex lensing arrangements which have neither been simple nor efficient. Nor have they been compatible with the fabrication techniques generally applicable to making the semiconductor devices in the first place.

Accordingly, it is an object of the present invention to provide an improved semiconductor light emitter wherein improved light efficiency is achieved.

It is a further object of the present invention to provide a semiconductor light emitter wherein improved light efficiency is achieved by a simple structure.

It is another object of the invention to provide a new semiconductor light emitter having an improved structure giving enhanced light efficiency, which is readily produced by semiconductor fabrication techniques.

It is a further object of the invention to provide an improved technique for the fabrication of a light emitting semiconductor device.

These and other objects of the invention are achieved in accordance with the invention by the use of a light emitting semiconductor device having its light emissive region defined within a circular mesa formed on a surface of a semiconductor wafer opposite to the light emitting surface of said wafer. This light emissive region may be a shallow junction close to the outer surface of the mesa. The mesa is formed in such a manner that its walls form a light collecting reflector for redirecting light generated in the mesa to the remote light emitting surface of said wafer.

In accordance with the further aspect of the invention, the walls of the mesa are obliquely inclined to the planar outermost surface of the mesa and have a slope in the neighborhood of 35 to 45 degrees. The depth of the mesa measured from its base to the light generating region should be a substantial fraction of its diameter, preferably a fraction less than one and in excess of ¼ the diameter of the mesa light generating region. Preferably the planar surface of the mesa is a reflectively coated contact surface.

Figure 2:
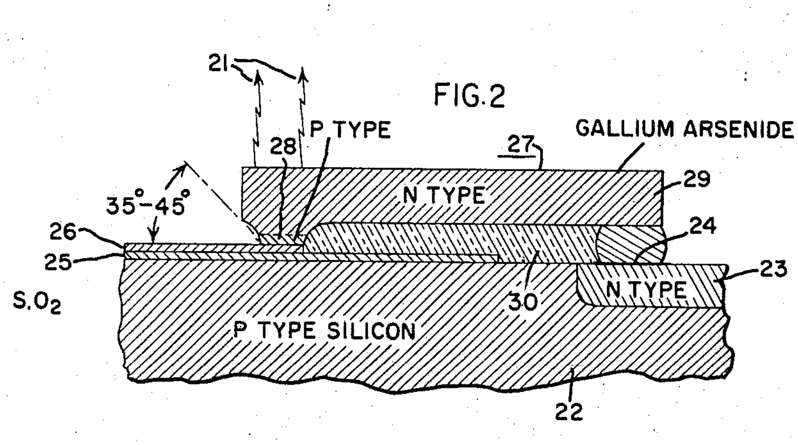

The novel and distinctive features of this invention are set forth in the claims appended to the specification. The invention itself, however, together with the further objects and advantages thereof may be understood by reference to the following description and accompanying drawings in which:

FIGURE 1 is a sectional view of an embodiment of the invention applicable to electrical circuitry in which individual electrical components are employed; and FIGURE 2 is a sectional view of a second embodiment of the invention applicable to monolithic or integrated circuit fabrication techniques.

Referring now to FIGURE 1, a gallium arsenide light emitter in accordance with the invention is shown. It consists of a semi-conductor light emitting PN junction provided with suitable mechanical supports and electrical connections for use as an individual electrical component.

The principal member of the light emitting junction is a rectangular wafer 11 of monocrystalline gallium arsenide doped with an N type impurity. A circular mesa 12 is formed on the under surface (as illustrated in FIGURE 1) of the wafer 11 by etching away the surrounding material of the wafer. A P region 13 is formed on the under surface of the mesa, creating a junction as illustrated by the dotted line 14 spaced part way up from the lowermost surface of the mesa 12. The light emitting junction is mechanically supported upon a header 15, which is conventionally a gold plated metallic member of a straw hat shape. The header 15 has one electrical connection 16 welded directly to its metallic under surface and a second electrical connection 17 also having a gold plated contact surface passing upwardly through the header. The second connection 17 is rigidly supported on the header in electrically insulated relation by means of a glass-to-metal seal 18. The N region of the diode is directly bonded by a tin or tin bismuth alloy bond at 19 to the conductor 17. Similarly, the P region 13 of the junction is bonded at 20 to the upper surface of the header 15 which is also coated with gold. The mesa can be bonded directly onto the gold by heating although other methods of attachment may be used.

When the junction is suitably energized by the passage of current through the junctions, as by application of a forward potential between the terminals 16 and 17 of the header, light is generated in the mesa region of the junction in close proximity to the junction. This light tends to propagate in all directions from its region of generation and as a result of the geometry of the light emitter, a substantial portion of the light generated in this region passes upwardly through the wafer 11, as illustrated by the arrows 21.

The photo emitter may be constructed in the following manner. The rectangular wafer 11 of gallium arsenide is sliced from a boule on the (111) plane. A material which has been found to be quite satisfactory has been a gallium arsenide doped with selenium with impurity concentrations varying from $7\times10^{17}$ to $3\times10^{18}$ per cc., the upper portion of this range being preferable. Tellurium doped materials and tin doped materials of corresponding concentrations may also be employed. The wafers are ordinarily sliced to a thickness of .015 inch. After cleaning, lapping and polishing for surface preparation which may reduce the thickness of the wafer to .009 inch, the wafer is sealed under vacuum in a quartz tube for diffusion of a P junction region on the surfaces of the wafer. For this purpose a few milligrams of 10% zinc, 90% tin and trace quantities of arsenic form a suitable diffusion material. The zinc is the principal component diffused into the gallium arsenide, while the tin and trace quantities of arsenic facilitate the diffusion process and prevent leaching out of arsenic from the wafer. Diffusion then takes place at a temperature usually selected in the range of from 750° to 900° C. and for a time of from ½ to 3 hours. The temperatures and times are selected to facilitate the creation of a diffusion density of about $10^{19}$ atoms per cc. and the time is selected to permit from ½ to ¼ mil surface penetration.

After diffusion, the wafer is lapped to a thickness of about .006 inch to remove one diffused surface. It may then be scribed and broken into rectangular bars of .020 by .040 inch.

The next step is the formation of the circular mesa. The remaining zinc diffused P surface is now masked by a small circular mask and exposed to an etchant. The mask may be from one to ten thousandths of an inch in diameter with diameters below five thousandths of an inch being typical for low current devices. The etching process is continued to a depth of from .0015 to .003 inch, thereby removing all the P region surrounding the mask as well as a substantial layer of the surrounding N region. Preferably the walls of the mesa are etched so as to provide a 35 to 45° average slope. This is best achieved by directing the etchant downwardly toward the surface during the etching process. When the etching is done in this manner, a white etch which is a mixture of hydrofluoric and nitric acids may be employed. Also, a more commonplace sulfuric acid and hydrogen peroxide ($H_2O_2$) etchant may be employed. Usually the reverse N face is masked during this process. Before attachment of the mesa surface to the header, a reflective gold surface may be formed thereon.

The light emitters of this general size may be operated with signal currents of from 1 to 20 millamperes at room temperatures. Gallium arsenide light emitters of the construction just outlined have measured quantum efficiencies in the neighborhood of from .7% to 1.4% at room temperatures and the light so radiated lies within a narrow band lying primarily within the range of from 8900 to 9200 angstrom units wavelength. The higher quantum efficiencies are usually achieved by operation at substantial current densities. This consideration dictates the selection of relatively small area junctions operated at the higher indicated current levels.

The foregoing construction, which employs a shaped mesa in which light is generated, is responsible in large measure for the high relative escape quantum efficiency of the arrangement. In effect, the light source is placed within a reflector, the walls of the reflector being provided in part by its under surface and in part by the tapering walls of the mesa. Due to the very high index of refraction of gallium arsenide only that light which is incident on the upper surface at angles of less than 15° is below the critical angle and is transmitted through the upper surface of the device. In effect, for each light producing element in the junction region, only a conical region whose half angle is approximately 15° emerges through the top surface of the gallium arsenide emitter. Even assuming no attenuation and that all of the emergent light can be collected, this corresponds to less than 4% of the total light emitted by that element (a figure calculated from the ratio of the area of a cone projected on a unit sphere to the full area of that sphere).

The presence of a totally reflecting surface on the under surface of the mesa can only double the amount of light directed upwardly toward the upper exit surface at less than the critical angle. Actually due to the greater attenuation of the light as it passes twice through the P region, the enhancement produced by this surface is usually more nearly a 50% improvement. Thus, assuming an ability to collect all emergent light and neglecting attenuation within the N region, one is still led to predict only a 5% to 6% maximum efficiency. Existent devices with this geometry are not known to have achieved efficiencies in excess of 0.3 percent.

By tapering the walls of the mesa in accordance with the invention so as to provide additional usefully reflective surfaces for redirecting more of the light generated at the junction upwardly through the exit surface of the emitter, one has been able to improve the amount of light collection from five to ten times over units lacking such surfaces.

This improvement may be explained by the fact that due to the high index of refraction of the gallium arsenide material and the obliquity of incidence, the walls of the mesa are almost purely reflective to most of the incident light. Orientation of the walls obliquely with respect to the direction of the principal source of light, which is in the region of the junction, therefore has the effect of redirecting a very substantial amount of the laterally directed light upwardly through the upper exit surface of the junction. This added light includes both that light coming directly to the mesa walls from an illuminated element and that reflected upon the walls of the mesa from the under surface of the mesa. When the dimensions of the mesa are chosen so that the ratio of the depth of the mesa (measured from the base of the mesa to the light emissive junction plane) to its diameter (measured at the junction plane) is substantial, as for instance 1 to 4 or greater, the mesa walls acting in cooperation with the under surface of the mesa collect light radiated over very considerable solid angles. The ratio should be less than one so that the light need not pass through excessive absorptive material in the mesa and so that optimum wall angles to achieve near normal incidence at the exit surfaces is obtained. Optimum wall reflection is achieved with an obliquity with the horizontal in the vicinity of 35 to 45 degrees. Since the junction plane where the light is developed is close to the outer surface of the mesa, dimensions measured to the junction plane are approximately the same as those measured to the outer surface of the mesa. Adoption of these measures leads to the indicated 5 to 10 time improvement in measured efficiency in light collection.

Further improvement in efficiency of the reflective surfaces of the mesa may be achieved by more nearly approximating the sphero-parabolic surfaces that purely optical considerations would dictate. However, even without resort to such ideal surfaces, the indicated major improvement in optical efficiency may be achieved by making the walls encompassing the light emitting region sufficiently oblique, preferably in the neighborhood of 35° to 45°, and subtending an appreciable solid angle in relation to the light producing centers, which is achieved by making the mesa of substantial depth in relation to its diameter, preferably in excess of 1 to 4.

Since the attenuation of the light generated at the junction is passing upwardly through the chip is quite high, minimum thickness of the chip 11 compatible with necessary fabrication techniques is usually desirable. A thickness of .006 inch appears to be a reasonable compromise, but lesser thicknesses may be achieved. Finally, also due to the high index of refraction of gallium arsenide, the efficiency of coupling to associated light detectors can be considerably enhanced by interposition of a light coupling path having indices of refraction in excess of air. A matching index would, of course, be preferred but materials of this nature are rare. At the present time several suitable materials in convenient liquid or deformable form exist. Such materials are the silicones having indices of about 1.6, which may take the form of a viscous oil, a jelly or a compressible wafer.

While the embodiment in FIGURE 1 is particularly adapted for use with circuitry involving individual components, the invention may also be applied in an integrated circuit environment. Such a construction is that illustrated in FIGURE 2. The integrated circuit there illustrated employs a substrate 22 of P type silicon with active elements such as the N type collector region 23 of a transistor (not fully shown) diffused into the silicon substrate. A conductive strip 24 may be formed on this N region for subsequent electrical contact purposes. The silicon substrate may be provided with a general silica layer 25 for creating a surface upon which conductive contacts may be laid down. Upon this layer 25, a second conductor 26 may be laid down for connection purposes.

At this point, the integrated circuit is ready for attachment of the gallium arsenide junction 27. This may be done by bonding the P region of the mesa 28 to the conductor 26, and the N region 29 of the gallium arsenide junction to the contact 24. Some improvement in the rigidity may be obtained by filling the region under the chip 27 with glass 30.

The foregoing assembly technique is also applicable with minor change to integrated circuits wherein the conductive paths are formed by direct diffusion into the substrate. Here the P region 28 of the junction would be bonded to contact laid down on a diffused conductive region.

While applicant has disclosed a particularly simple way of etching a mesa for improving the collection of light from the light emitting junction region, it should be apparent that other fabrication techniques may also be employed. It should also be apparent that while the reflection surfaces employed only crudely approximate ideal reflective surfaces, that closer approximations to the ideal may be achieved without a departure from the inventive teaching.

Finally, the invention should not be considered as restricted to the indicated exemplary gallium arsenide materials.

While specific embodiments of the invention have been shown and described, modifications and changes therein may be made by those skilled in the art without departing from the spirit of the invention.

What is claimed as new and desired to be secured by Letters Patent of the United States is as follows:

1. A semiconductor light emitter comprising a wafer of light transmissive semiconductor material, a mesa formed on one surface of said wafer containing a light emissive region, said mesa having a planar surface bounded by walls obliquely inclined to said planar surface of a height which is a substantial fraction of the width of said mesa, to intercept an appreciable amount of light emitted in said region and to redirect said intercepted light toward the remote, light emitting surface of said wafer.

2. A semiconductor light emitter as set forth in Claim 1 wherein said walls have an average obliquity of from 35 to 45 degrees to the plane of said planar surface.

3. A semiconductor light emitter as set forth in claim 1 wherein said mesa is circular, and the ratio of the depth of said mesa measured from its base to said light emissive region to the diameter of said region is a fraction less than one and in excess of 1 to 4.

4. A semiconductor light emitter as set forth in claim 1 wherein said planar surface is reflective; said walls have an average obliquity of from 35 to 45 degrees to the plane of said planar surface, and said mesa is circular, the ratio of the depth of said mesa measured from its base to said light emissive region to the diameter of said region is a fraction less than one and in excess of 1 to 4.

5. A semiconductor light emitter as set forth in claim 1 wherein the light emissive region is a junction formed under said planar surface.

6. A semiconductor light emitter as set forth in claim 1 wherein said wafer is of a doped light productive semiconductor material of a first conductivity type and said light emissive region is a junction formed of a semiconductor material of a complementary impurity type, disposed contiguous to said planar surface and having a depth substantially less than the height of said mesa.

7. A semiconductor light emitter comprising a wafer of light transmissive semiconductor material, a mesa formed on one surface of said wafer containing a light emissive region, the walls of said mesa being contoured to form a light collecting reflector for redirecting light generated in said light emissive region impinging thereon to the remote light emitting surface of said wafer.

8. A semiconductor light emitter as in claim 7 wherein said contour is of the type produced by a controlled etching process.

9. The method of making a semiconductor light emitter comprising forming a wafer of a first conductivity type, diffusing a junction of complementary conductivity type on the surface of said wafer, masking a small region of said junction, and etching the same to create oblique mesa walls by directing a flow of etchant perpendicular to the surface of said mask, said etching being continued to a depth substantially in excess of the depth of said complementary material.

References Cited

UNITED STATES PATENTS

| | | | |
|---|---|---|---|
| 3,233,305 | 2/1966 | Dill | 317—235 |
| 3,260,634 | 7/1966 | Clark | 317—235 |

OTHER REFERENCES

Hilsum: Semiconductors for Illumination?, Radio Electronics, June 1965, pages 49–51.

Sandlin: Optoelectronics Today, 1–1965, EDN, 13 pp.

JAMES W. LAWRENCE, *Primary Examiner.*

R. JUDD, *Assistant Examiner.*